United States Patent
MacNeil et al.

(10) Patent No.: US 11,643,744 B2
(45) Date of Patent: May 9, 2023

(54) APPARATUS FOR ELECTROCHEMICALLY PROCESSING SEMICONDUCTOR SUBSTRATES

(71) Applicant: SPTS TECHNOLOGIES LIMITED, Newport (GB)

(72) Inventors: John MacNeil, Cardiff (GB); Martin Ayres, Chepstow (GB); Trevor Thomas, Cardiff (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 17/357,406

(22) Filed: Jun. 24, 2021

(65) Prior Publication Data

US 2021/0317592 A1 Oct. 14, 2021

Related U.S. Application Data

(62) Division of application No. 15/876,300, filed on Jan. 22, 2018, now Pat. No. 11,066,754.

(30) Foreign Application Priority Data

Jan. 24, 2017 (GB) ...................... 1701166

(51) Int. Cl.
*C25D 17/00* (2006.01)
*C25D 17/06* (2006.01)
(Continued)

(52) U.S. Cl.
CPC ......... *C25D 17/001* (2013.01); *C25D 17/004* (2013.01); *C25D 17/06* (2013.01);
(Continued)

(58) Field of Classification Search
CPC ................................ C25D 5/028; C25D 7/12
See application file for complete search history.

(56) References Cited

U.S. PATENT DOCUMENTS 6,416,647 B1 7/2002 Dordi et al.
6,800,187 B1 * 10/2004 Reid ........................ C25D 5/08
204/224 R (Continued)

FOREIGN PATENT DOCUMENTS

CN 1632914 A 6/2005
CN 104011845 A 8/2014
(Continued)

OTHER PUBLICATIONS

EPO, Communication Pursuant to Article 94(3) EPC for EP Application No. 18152649.2, dated Jul. 5, 2022.
(Continued)

*Primary Examiner* — Harry D Wilkins, III
(74) *Attorney, Agent, or Firm* — Hodgson Russ LLP

(57) ABSTRACT

A method of processing a semiconductor wafer is provided. The method includes introducing the wafer to a main chamber via a loading port, using a transfer mechanism to transfer the wafer to a first wafer processing module in a stack so that the wafer is disposed substantially horizontally in the first wafer processing module with a front face facing upwards, and performing a processing step on the front face of the wafer in the first wafer processing module.

19 Claims, 5 Drawing Sheets

(51) Int. Cl.
*H01L 21/67* (2006.01)
*H01L 21/677* (2006.01)
*H01L 21/687* (2006.01)
*H01L 21/288* (2006.01)

(52) U.S. Cl.
CPC ...... *H01L 21/6719* (2013.01); *H01L 21/6723* (2013.01); *H01L 21/67178* (2013.01); *H01L 21/67196* (2013.01); *H01L 21/67766* (2013.01); *H01L 21/67769* (2013.01); *H01L 21/67778* (2013.01); *H01L 21/68707* (2013.01); *H01L 21/2885* (2013.01)

(56) References Cited

U.S. PATENT DOCUMENTS

| | | | | |
|---|---|---|---|---|
| 7,267,749 | B2* | 9/2007 | Wilson | C25D 17/001 204/212 |
| 7,445,697 | B2* | 11/2008 | Keigler | C25D 21/10 118/500 |
| 8,500,968 | B2* | 8/2013 | Woodruff | C25D 17/001 204/194 |
| 9,017,528 | B2* | 4/2015 | Papapanayiotou | C25D 21/22 204/252 |
| 2001/0000891 | A1* | 5/2001 | Kosaki | C25D 7/123 428/688 |
| 2003/0166382 | A1 | 9/2003 | Ashjaee et al. | |
| 2004/0079633 | A1 | 4/2004 | Cheung et al. | |
| 2004/0104120 | A1* | 6/2004 | Wang | H01L 21/6723 204/198 |
| 2004/0262150 | A1* | 12/2004 | Yajima | C25D 7/123 204/224 R |
| 2005/0208774 | A1* | 9/2005 | Fukunaga | C23G 3/027 257/E21.174 |
| 2007/0147982 | A1 | 6/2007 | Rice et al. | |
| 2012/0037495 | A1* | 2/2012 | Woodruff | C25D 17/001 204/212 |
| 2012/0100709 | A1* | 4/2012 | Minami | C25D 17/00 118/712 |
| 2014/0151218 | A1* | 6/2014 | Woodruff | C25D 17/001 204/279 |
| 2014/0284216 | A1* | 9/2014 | MacNeil | C25D 17/001 205/640 |

FOREIGN PATENT DOCUMENTS

| | | |
|---|---|---|
| CN | 105529293 A | 4/2016 |
| DE | 102015109393 A1 | 12/2016 |
| EP | 0992062 A2 | 4/2000 |
| EP | 1492907 A1 | 1/2005 |
| EP | 2781630 A1 | 9/2014 |
| JP | H10229111 A | 8/1998 |
| JP | 2001223184 A | 8/2001 |
| JP | 2005146334 A | 6/2005 |
| JP | 2007119923 A | 5/2007 |
| KR | 20100130826 A | 12/2010 |
| TW | 201229307 A1 | 7/2012 |
| WO | 0032835 A2 | 6/2000 |
| WO | 2009114965 A1 | 9/2009 |

OTHER PUBLICATIONS

KIPO, First Office Action for KR Application No. 20180008716, dated Feb. 14, 2022.
TIPO, First Office Action for TW Application No. 107102364, dated Mar. 29, 2021.
JPO, First Office Action for JP Application No. 2018009665, dated Dec. 6, 2021.
Yang et al., "Experimental researches on the early growth characteristics of BaMoO4 thin film by using aelectrochemical technique," Mar. 20, 2006, China Academic Journal Electronic Publishing House.
CNIPA, Office Action for CN Application No. 201810069614.3, dated Feb. 8, 2023, (see X/Y/A designations on pp. 7-8).

* cited by examiner

APPARATUS FOR ELECTROCHEMICALLY PROCESSING SEMICONDUCTOR SUBSTRATES

CROSS-REFERENCE TO RELATED APPLICATIONS

This application is a division of U.S. patent application Ser. No. 15/876,300, filed on Jan. 22, 2018, which claims priority to UK Patent Application No. 1701166.9, filed on Jan. 24, 2017, the entire disclosures of which are incorporated by reference herein.

BACKGROUND

This invention relates to an apparatus for electrochemically processing semiconductor substrates and to associated methods of electrochemical processing. This invention has particular, but by no means exclusive, relevance to a plating apparatus, and to associated methods of electrochemical and electroless deposition onto semiconductor substrates.

Electrochemical or electroless deposition processes are frequently used to form conducting layers in semiconductor device fabrication. These electroplating techniques are useful in achieving void free filling of vias, such as through silicon vias (TSVs), in particular for high aspect ratio features. For example, copper interconnects may be formed by electrochemical deposition during damascene processing. Similarly, Cu, Ni, SnAg and Au (among other metals) are known to be deposited onto silicon or compound semiconductor substrates in semiconductor packaging applications using electrochemical or electroless deposition methods. These plating techniques are applicable when semiconductors and components are embedded in an epoxy mould such as in Fan out Wafer level packaging (FO-WLP). The emergence of embedded die formats such as FO-WLP enables the use of rectangular panel substrates to reduce manufacturing costs.

Electrochemical deposition (ECD) processes in the semiconductor industry typically include immersing an individual semiconductor wafer into an electrolyte. A potential is applied between the wafer (acting as a cathode) and a second electrode (acting as an anode) such that species in the electrolyte are deposited on the front face of the wafer. Typically the back face of the wafer is not exposed to the electrolyte. For the inverse process, that is electrochemical etching, the deposited layer may be removed when the wafer is acting as an anode and the second electrode acts as a cathode.

In automated ECD systems, a robot arm typically collects the semiconductor wafer from a loading/unloading port. This may be a cassette or front opening unified pod (FOUP). The robot arm moves the wafer to a wafer holding fixture which creates an electrical contact with the wafer. A fluid seal is formed between the wafer holding fixture and the front face of the wafer to prevent any electrolyte from contaminating the electrical contacts or the back face of the wafer.

Two generic approaches are used to immerse the wafer in the electrolyte—"fountain cell" and "rack" systems. In "fountain cell" systems the wafer is kept in a substantially horizontal plane during processing. The wafer enters the electrolyte from above the deposition bath with the front face of the wafer (ie. the processing/deposition surface) facing downwards. The electrolyte may be flowed in a perpendicular direction towards the front face of the wafer. The wafer may be rotated to establish a uniform diffusion layer thickness across the wafer surface which helps to deposit a uniform layer. U.S. Pat. Nos. 8,500,968 and 6,800,187 disclose "fountain cell" systems.

In "rack" systems the wafer is maintained in a substantially vertical plane and held statically in the electrolyte during processing.

For either the "fountain cell" or "rack" systems the electrolyte may be circulated within the electrolyte bath by means of a pump at relatively high flow rates, for example at 8-40 litres per minute.

Multiple processing baths may be incorporated into a single wafer processing system so that numerous processing steps may be performed sequentially to maximise wafer throughput. Processing steps could comprise multiple electrodeposition steps, such as deposition of a copper pillar with a Ni/SnAg cap; chemical etching steps; and numerous spin-rinse-drying (SRD), wetting and cleaning steps.

It is preferable for each processing bath to be easily accessible by the user to permit maintenance and cleaning of the processing baths. Maintenance may comprise replacing the anode in an electroplating cell. Multiple processing baths for "fountain cell" and "rack" systems are typically arranged in one or more rows such that each processing bath can be accessed from high above by a robot arm on a linear track and by a user for maintenance. The wafer transport systems used in "fountain cell" and "rack" type systems may be complicated, often implementing wafer holding fixtures, an EFEM (equipment front end module) robot, and an overhead robot for transferring the wafer between processing baths and clean stations. It would be desirable for the wafer transfer between processing baths to be simplified.

Advanced wafer processing systems often require a large number of processing baths, potentially more than 20. A linear arrangement of processing baths can result in the wafer processing system having a large tool footprint, potentially more than 6 m in length.

SUMMARY

It is desirable to reduce the tool footprint of wafer processing systems in wafer fabrication or semiconductor packaging facilities such that a large number of processing steps may be performed with a high throughput and a minimal tool footprint.

It is also desirable to reduce the tool footprint of wafer processing systems including multiple processing baths while maintaining easy access to each processing bath for maintenance and cleaning purposes.

It will be appreciated that, in addition to the specific problems described above, there is a general desire and need to reduce the tool footprint of wafer processing systems. The present invention, in at least some of its embodiments, addresses at least some of these problems, desires and needs.

According to a first aspect of the invention there is an apparatus for processing a front face of a semiconductor wafer comprising:

a main chamber;

at least one loading port connected to the main chamber for introducing the wafer to the main chamber;

at least one stack of wafer processing modules comprising three or more substantially vertically stacked wafer processing modules, wherein adjacent wafer processing modules in the stack have a vertical separation of less than 50 cm, and each processing module is configured to process the wafer when disposed substantially horizontally therein with the front face of the wafer facing upwards, and at least one wafer processing module is an electrochemical wafer processing module; and a transfer mechanism for transferring the wafer between the loading port and the processing modules.

Processing may comprise chemical and/or electrochemical processing. Processing may comprise one or more of etching, electrochemical deposition, electrochemical polishing, electroless deposition, rinsing steps, cleaning steps, and drying steps. Thus, one of the processing modules used in the apparatus may be an etching, electrochemical deposition, electrochemical polishing, electroless deposition, rinsing, cleaning, or drying module. One of the processing modules used in the apparatus may be a spin rinse dry module.

The semiconductor wafer may be a 300 mm silicon wafer, any other suitable semiconductor substrate or a rectangular panel. The apparatus may be suitable for processing a plurality of semiconductor wafers in parallel. The loading port may be a cassette or a FOUP (front opening unified pod).

The electrochemical wafer processing module may comprise a seal which, in use, seals against a surface to define a sealed cavity in which electrochemical processing takes place. The seal may be an elastomeric seal.

In some embodiments, the seal, in use, seals against a surface of the wafer to define the sealed cavity in which electrochemical processing takes place. Preferably, the surface of the wafer that the seal seals against is an upper surface of the wafer.

The apparatus may further comprise at least one wafer carrier arrangement onto which the wafer can be loaded. The wafer carrier arrangement may comprise a seal which, in use, seals against a surface of the wafer. Preferably, this seal seals against an upper surface of the wafer. The transfer mechanism may be configured to transfer a loaded wafer carrier arrangement between the loading port and the processing modules. In these embodiments, the seal of the electrochemical wafer processing module may, in use, seal against a surface of the wafer carrier arrangement to define the sealed cavity in which electrochemical processing takes place.

Typically, the wafer carrier arrangement also comprises an electrical contact for making an electrical contact with a loaded wafer.

The apparatus may further comprise a wafer carrier arrangement loading station for loading the wafer onto the wafer carrier arrangement. Typically, the wafer carrier arrangement loading station also unloads the wafer once processing has been completed. The loading port may comprise the wafer carrier arrangement loading station. Alternatively, the wafer carrier arrangement loading station may be positioned between the loading port and the processing modules. Alternatively still, the wafer carrier arrangement loading station may be positioned prior to the loading port so that, when the wafer is introduced to the main chamber, the wafer is loaded onto the wafer carrier arrangement before passing through the loading port.

Adjacent processing modules in the stack preferably have a vertical separation of less than 25 cm. The apparatus may comprise at least one processing module that is not part of a stack.

The transfer mechanism may comprise a transfer robot having at least one end effector for automated transfer of the wafer between the loading port and the processing modules. The transfer mechanism may transfer the wafer between the loading port and any of the processing modules.

At least one of the wafer processing modules may comprise an electrochemical deposition wafer processing module. The front face of the wafer may comprise an electrode. The electrochemical processing module may further comprise a second electrode. An electrical bias may be applied to the wafer. The front face of the wafer may comprise a cathode.

The processing modules may further comprise a tray positioned below the seal for collecting fluid.

The processing modules may be removable from the stack. The processing modules may be independently removable from the stack. The removable nature of the processing modules may allow the processing modules to be readily accessed for the purposes of maintenance, servicing and repair work.

The processing modules may be removable from the stack in a substantially horizontal direction. The processing modules may be removable from the stack by rotating, sliding or by any other suitable means.

The apparatus may further comprise a blower for maintaining a laminar air flow in the main chamber.

The apparatus may further comprise a wafer alignment tool.

The apparatus may comprise at least three stacks. The at least three stacks may be arranged in rows or in any other suitable arrangement.

The apparatus may be configured to process the front face of two or more semiconductor wafers in parallel.

According to a second aspect of the invention there is a method of processing a semiconductor wafer using the apparatus according to claim 1 comprising the steps of:

introducing the wafer to the main chamber via the loading port;

using the transfer mechanism to transfer the wafer to a first wafer processing module in the stack so that the wafer is disposed substantially horizontally in the first wafer processing module with the front face facing upwards; and performing a processing step on the front face of the wafer in the first wafer processing module.

The method may comprise the further steps of: using the transfer mechanism to transfer the wafer from the first wafer processing module to a second wafer processing module in the stack so that the wafer is disposed substantially horizontally in the second wafer processing module; and performing a processing step on the front face of the wafer in the second wafer processing module.

The method may comprise the further step of using the transfer mechanism to transfer the wafer from a wafer processing module to the loading port for subsequent transfer out of the apparatus.

At least one processing step performed on the front face of the wafer may be selected from the group comprising a chemical, electrochemical, rinsing, cleaning, spinning, or drying step. The electrochemical processing step may comprise optionally electrochemical deposition or electrochemical etching. The electrochemical processing step is performed in the electrochemical wafer processing module. The electrochemical wafer processing module may comprise a seal which seals against a surface to define a sealed cavity in which electrochemical processing takes place. The seal may seal against a surface of the wafer, preferably an upper surface of the wafer, to define the sealed cavity in which electrochemical processing takes place. Alternatively, the apparatus may further comprise a wafer carrier arrangement onto which the wafer can be loaded, the wafer carrier arrangement comprising a seal which seals against a surface of the wafer, preferably an upper surface of the wafer, wherein the transfer mechanism transfers the loaded wafer carrier arrangement between the loading port and the processing modules. The seal of the electrochemical wafer processing module may seal against a surface of the wafer carrier arrangement to define the sealed cavity in which electrochemical processing takes place.

The method may further comprise the step of loading the wafer onto the wafer carrier arrangement. The step of loading the wafer onto the wafer carrier arrangement may be performed prior to or as part of the step of using the transfer mechanism to transfer the wafer to a first wafer processing module in the stack.

An electrical bias may be applied to the wafer during at least one processing step performed on the front face of the wafer.

Two or more semiconductor wafers may be processed in parallel.

According to a third aspect of the invention there is a method of servicing an apparatus according to the first aspect of the invention comprising the step of removing a wafer processing module from the stack in a substantially horizontal direction to provide access to the wafer processing module.

Servicing may comprise performing maintenance and/or repair work on the apparatus.

The step of removing the wafer processing module from the stack in a substantially horizontal direction may comprise rotating or sliding the processing module.

Whilst the invention has been described above, it extends to any inventive combination of the features set out above or in the following description, drawings or claims. For example, any feature described in relation with the first aspect of the invention is considered to be disclosed also in relation to any other aspect of the invention.

BRIEF DESCRIPTION OF THE DRAWINGS

Embodiments of methods and apparatus in accordance with the present invention will now be described, by way of example only, and with reference to the accompanying drawings, in which.

Where the same reference numerals have been used in different exemplary embodiments, the reference numerals correspond to features that are identical.

DETAILED DESCRIPTION

Figure 1:
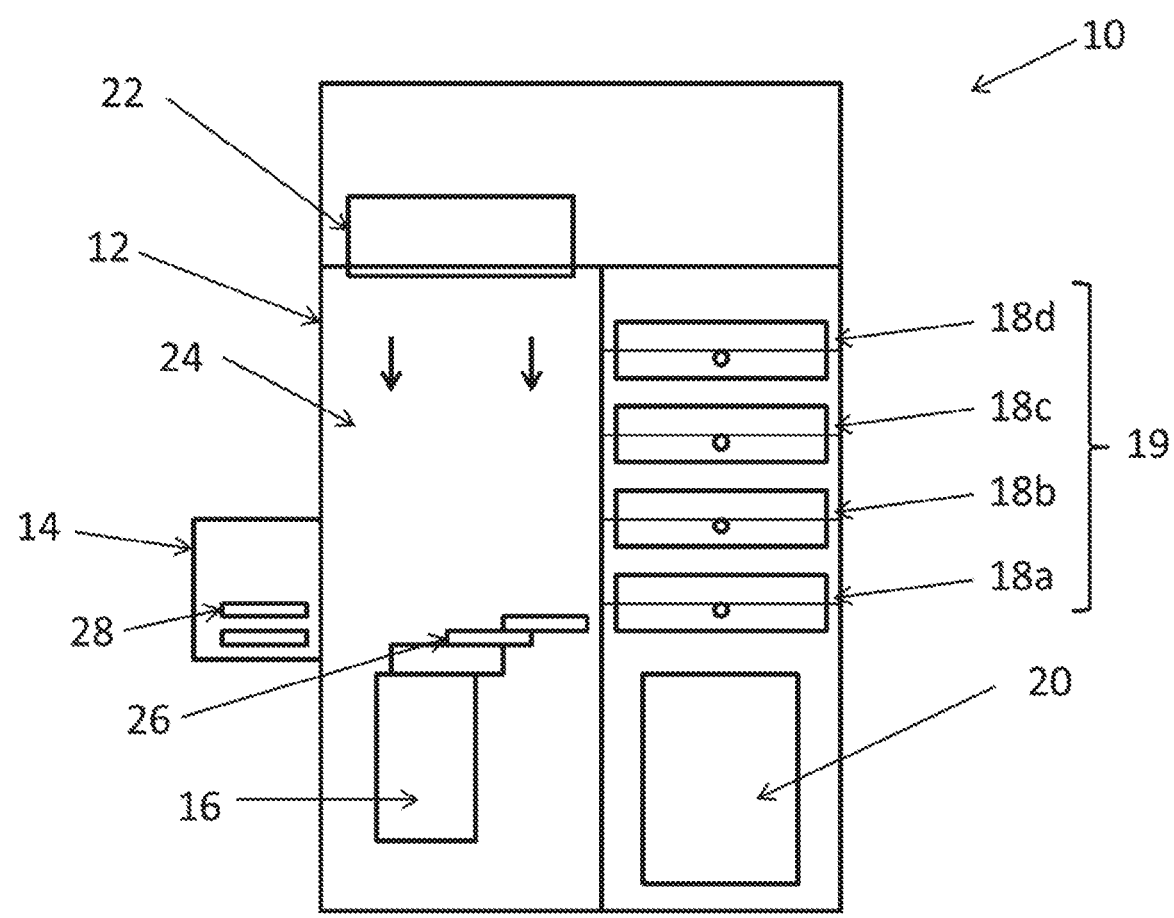
FIG. 1 is a schematic view of a wafer processing system including stacked processing modules.

FIG. 1 shows a wafer processing system 10 according to a first embodiment of the present invention. The wafer processing system 10 comprises a frame 12, a loading/unloading port 14, a robot 16 and a plurality of stacked processing modules 18a-18d. Other embodiments of the present invention may incorporate fewer or more than four processing modules depending on the number of processing steps required and the vertical transfer reach of the transfer robot 16. The processing modules may each individually be suitable for wet chemical processing steps, such as electrochemical deposition, electrodeposition, electropolishing, chemical etching and the like; and cleaning, rinsing and drying processing steps. All positions in the stack can accommodate any module configuration and be suitable for performing any processing step. The hardware may be easily changed when process demands change.

The wafer processing system 10 may also comprise local fluid supplies 20 located underneath the processing modules 18a-d. The local fluid supplies 20 may supply processing fluid, such as electrolyte, to each processing module 18a-d. Electronic control, monitoring circuitry and power supplies for the modules (not shown) may be situated above the processing modules 18a-d. Ancillary features (not shown), such as power distribution for the wafer processing system 10, bulk electrolyte storage and monitoring equipment may be situated remotely from the wafer processing system 10.

The frame 12 encloses the components of the wafer processing system to provide a contaminant-free environment in which wafer processing can take place. A laminar airflow is produced by fan or blower 22 to maintain a particulate-free environment within the main chamber 24.

The loading/unloading port 14 allows semiconductor wafers 28, such as 300 mm diameter silicon wafers, to be loaded into and unloaded from the wafer processing system 10. The loading/unloading port 14 may be a cassette or a FOUP (front opening unified pod). The port 14 may also serve as a wafer storage location in between processing steps.

The robot 16 comprises an end effector 26 which contacts the back face of the wafer 28 (ie. the face of the wafer not subjected to processing) and transfers it to one of the processing modules 18a-d. In one embodiment, the wafer 28 is handled with the front face of the wafer (ie. the face to be processed) facing upwards during all handling and processing steps. In one embodiment of the invention there may also include a wafer alignment step (not shown) prior to the wafer being transferred to one of the processing modules 18a-d. The use of a wafer transfer robot 16 allows automated wafer transfer between the port 14 and the processing modules 18a-d.

The processing modules 18a-d are arranged in a vertical stack 19. Vertically stacking the processing modules 18a-d significantly reduces the tool footprint of the wafer processing system 10 compared with known systems using an equivalent number of processing modules. It is preferable to use a low profile processing module, that is, a processing module with a height of less than approximately 30 cm. More preferably a low profile module will have a height of less than 22 cm. Use of a low profile processing module enables more efficient vertical stacking. Known fountain cell and rack type systems require a large overhead volume in order for the substrate to enter the processing module from above. Consequently, known fountain cell and rack type systems are not well suited for efficient vertical stacking.

Figure 2:
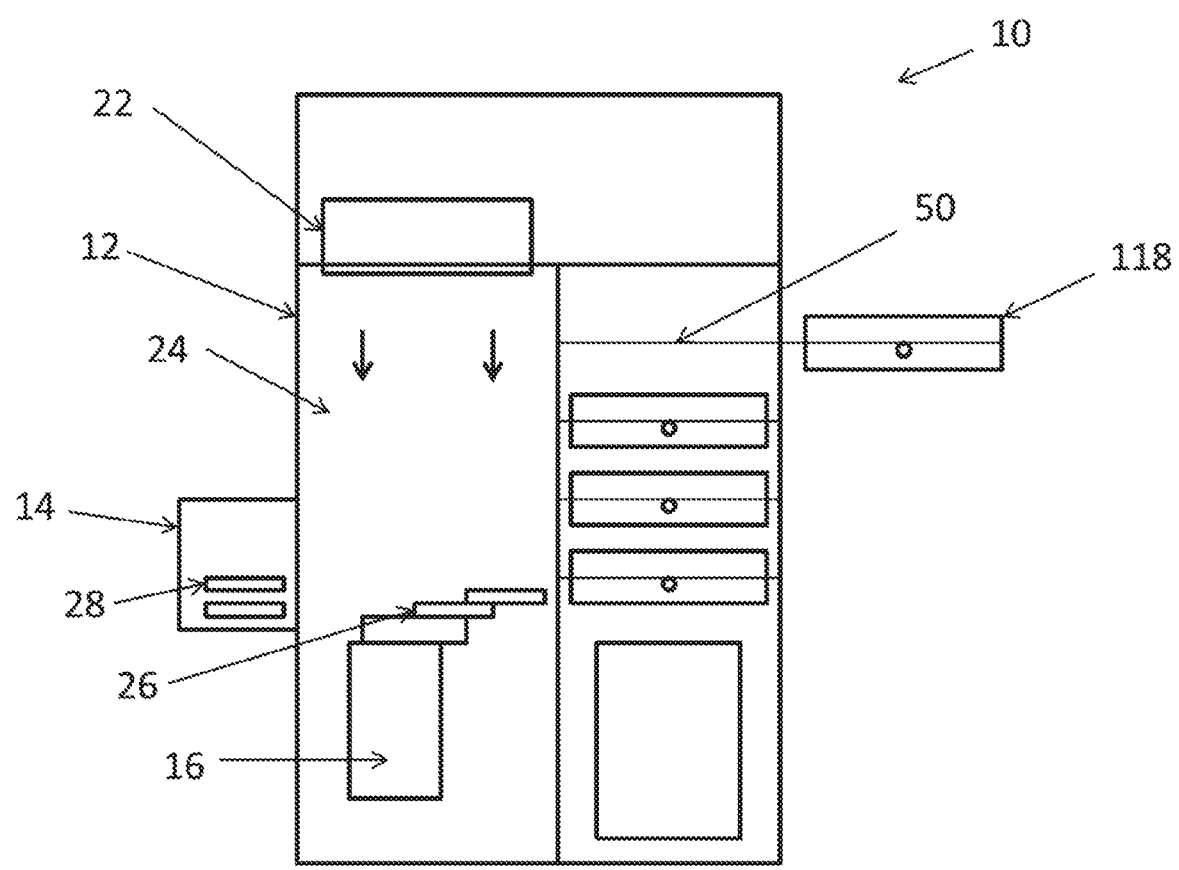
FIG. 2 is a schematic view of a wafer processing system with a processing module removed to allow access for maintenance purposes.

Access may be gained to each processing module 18a-d by sliding or rotating a processing module out of the vertical stack 19 as shown in FIG. 2. Each processing module may be independently removable from the stack. This may be required when system intervention is required, for example, when changing an anode or to conduct a manual clean within the module. The isolated processing module 118 may remain connected to the wafer processing system 10 through the extendable fixture 50 to aid the replacement of the isolated processing module. The extendable fixture may also be attached to the frame 12. Removal of an individual processing module in this way enables complete and facile access to the isolated module.

Figure 3:
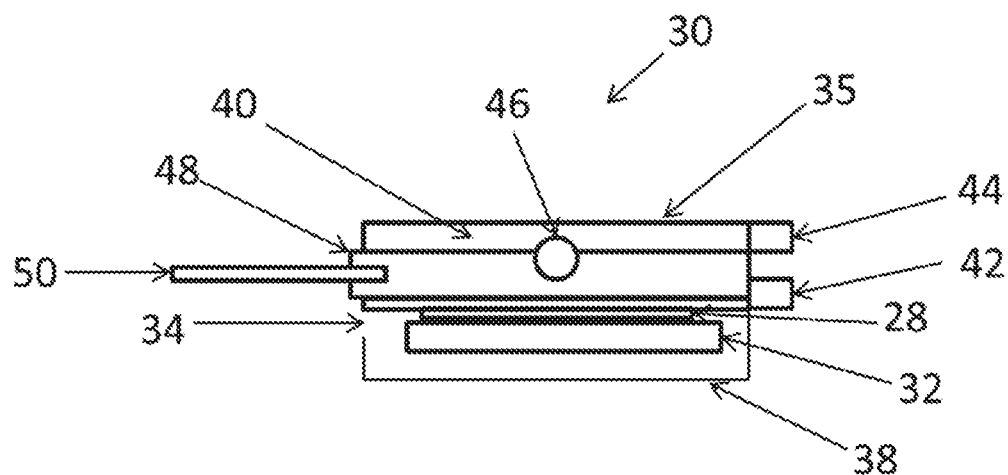
FIG. 3 is a schematic view of a processing module.
Figure 4:
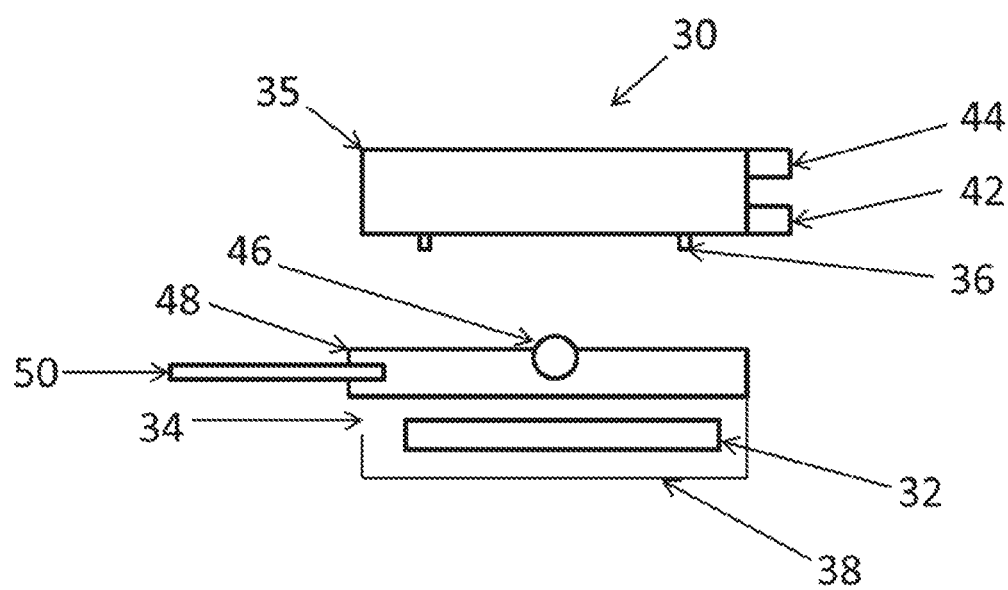
FIG. 4 is an exploded schematic view of a processing module.
Figure 5:
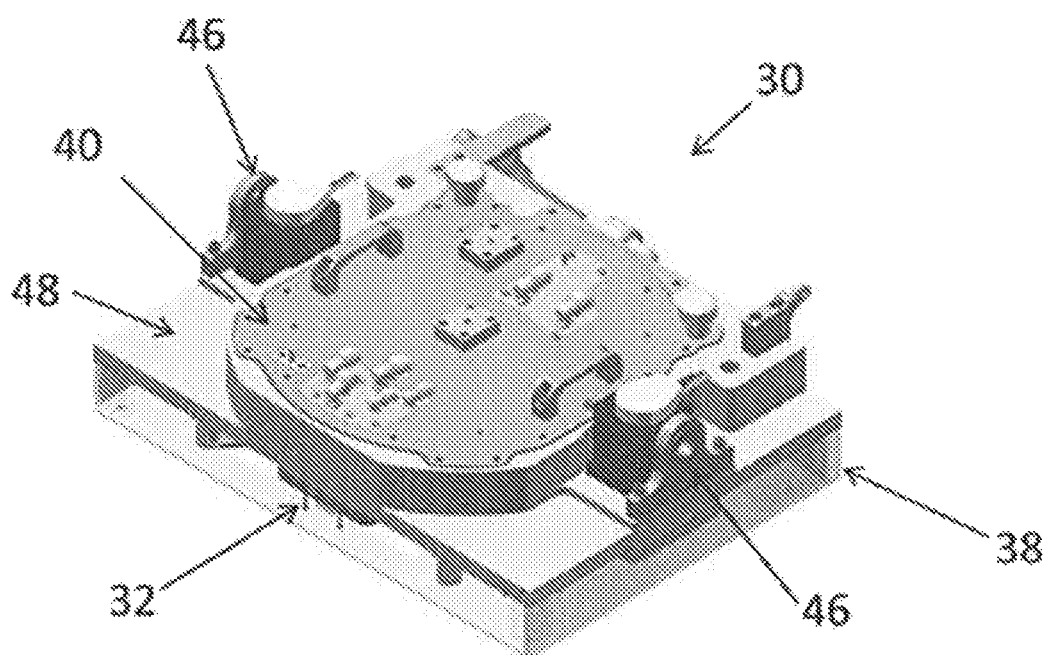
FIG. 5 is a perspective view of a processing module.

A wet chemical processing module 30 suitable for incorporation into the wafer processing system 10 is shown in FIGS. 3, 4 and 5. Wafer processing modules suitable for incorporation into the wafer processing system 10 are also described in EP2781630 and EP2652178. The wafer is transferred from the end effector 26 of the robot arm to a movable platen assembly 32 via entry slot 34. The movable platen assembly 32 may be a rotatable platen assembly.

The platen assembly 32 is raised such that the front surface of the wafer mates with the anode chamber 35. A fluid seal is formed between the front face of the wafer and an elastomeric seal 36. The elastomeric seal may be frustro-conical shaped to afford a reliable fluid tight seal. Furthermore, a seal of this shape will not fall out of the chamber due to gravity or surface tension with the surface of the wetted wafer. The elastomeric seal may be attached to the anode chamber 35.

A fluid tight seal is required to prevent fluid leaking from the processing module during the processing step. A containment tray 38 may be positioned below the platen 32 to contain any fluid leaks that may occur.

If required, an electrical contact to the wafer 28 may also be formed so that the wafer may serve as an electrode. The electrical contacts may be attached to the anode chamber 35. The electrical contacts may be made using titanium electrodes, Pt-coated titanium electrodes or electrodes made from any other suitable electrically conducting material. The electrodes may contact the wafer surface in the edge exclusion area. The edge exclusion area is typically <2-3 mm from the wafer edge. The fluid tight seal prevents the electrical contacts from becoming exposed to or contaminated by the processing fluid.

The wafer may be a cathode or an anode depending on the processing step. For the purposes of example only, a DC bias may be applied to the wafer when acting as a cathode in an electrochemical deposition process. The anode in this process may be a consumable metal, such as Cu, Ni or Sn, or an inert contact, such as Pt-coated Ti or mixed metal oxide (MMO).

The wafer 28 and the anode chamber 35 define a sealed cavity 40 in which wet chemical processing may occur. Wet chemical processing may comprise one or more of inter alia electrochemical or electroless deposition, electrochemical etching, and chemical etching. The fluid seal between the wafer 28 and the anode chamber 35 is made before any fluid enters the cavity 40. Fluid may enter and leave the cavity 40 though fluid connectors 42 and 44. The fluid may be an electrolyte or other suitable fluid dependent upon the processing step to be performed. In one embodiment the connector 42 is a fluid inlet whilst the connector 44 is a fluid outlet. In another embodiment the connector 42 is a fluid outlet whilst the connector 44 is a fluid inlet. It is preferable to incorporate more than one fluid connector if high fluid flow rates through the processing module are required. Multiple fluid inlets help to precisely control fluid flow rate and help to ensure gas/air pockets do not form in the cavity 40, which can affect the quality of the processing step. For example, an air pocket in an electrodeposition step may affect the uniformity of the resultant deposit.

The fluid is removed from the processing module 30 after the processing step is complete and before the fluid seal between the wafer 28 and the anode chamber 35 is broken. Fluid may be removed via fluid connectors 42 and 44. The processing module 30 may be tilted to aid fluid removal using tilting bracket 46. The tilting bracket 46 is mounted on a support plate 48. The support plate 48 may be fixed to the anode chamber 35 via a series of retaining bolts (not shown). The fluid may be recycled for use in future processing steps.

If required, a rinse step may be performed prior to the removal of the wafer 28 from the processing module 30.

A processing module may be used for cleaning, rinsing, wetting or drying processes. For rinsing, cleaning or drying, the wafer 28 may be rotated by using a rotatable platen assembly. Cleaning fluid may be jetted towards the front face of the wafer surface for cleaning and/or wetting purposes. After removing the cleaning fluid from the cavity 40, a subsequent high speed drying step may be initiated. The drying process may be accelerated by rotating the platen assembly, for example up to 3000 revolutions per minute (rpm). A spin rinse dry (SRD) module may be provided which has a rotatable platen and one or more sprays.

To remove the wafer 28 from the processing module 30, the platen assembly 32 is lowered, which breaks the fluid seal. The end effector 26 of the robot arm may collect the wafer 28. The wafer 28 may be transferred to a further processing module or to the loading port 14 for temporary storage or removal from the wafer processing system 10.

The support plate 48 may be attached to an extendable fixture 50. The extendable fixture 50 may remain connected to the processing module 30 when the processing module is removed from the frame 12. The extendable fixture may comprise a means of supplying the processing module 30 with electrical power necessary to perform electrochemical processing steps.

After the processing module 30 has been isolated from the frame 12, maintenance may be carried out on the processing module. The retaining bolts and fittings (not shown) may be removed to enable the anode chamber 35 to be detached from the module 30. The anode chamber 35 can then either be replaced by a new chamber, refurbished or replaced as appropriate.

Access to the platen assembly 32 is provided after the anode chamber 35 has been removed. Access to the platen assembly 32 may also be achieved by removal of the containment tray 38.

The processing modules 18a-d of the wafer processing system 10 are arranged in a vertical stack 19. This is not a practical arrangement for known wafer processing systems, such as "fountain cell" and "rack" type systems. For these known systems, it is necessary for the electrolyte bath to have an open top with a large depth to allow the wafer to be fully submerged. A vertically stacked arrangement of open topped processing baths would be vulnerable to contamination from the processing fluid in the bath above. Furthermore, a large vertical separation (or pitch) is necessary to stack such known processing baths. Without a large vertical separation, the upper baths would at least partially block the entry of the wafer into the electrolyte bath from above. In addition the user's access to the processing baths for maintenance and cleaning purposes would also be at least partially restricted. Maintenance may comprise replacing the anode in an electrodeposition cell.

The design of the processing module 30 allows processing modules to be stacked vertically in a significantly more efficient and compact arrangement without restricting the entry of the wafer into each processing module. Each processing module may also be readily accessed by removing the processing module from the vertical stack 19. This also allows hardware to be changed easily when process demands change.

All fluid wetted surfaces are typically fabricated using plastic materials such as PVC (polyvinyl chloride), HDPE (high density polyethylene), PVDF (polyvinylidene fluoride), PTFE (polytetrafluoroethylene), or PFA (perfluoroalkoxy). The preferred material is determined by chemical compatibility, mechanical properties and cost.

As a consequence of the simplified handling system and processing module arrangement, the wafer processing system 10 may be built in a cost effective fashion.

Figure 6:
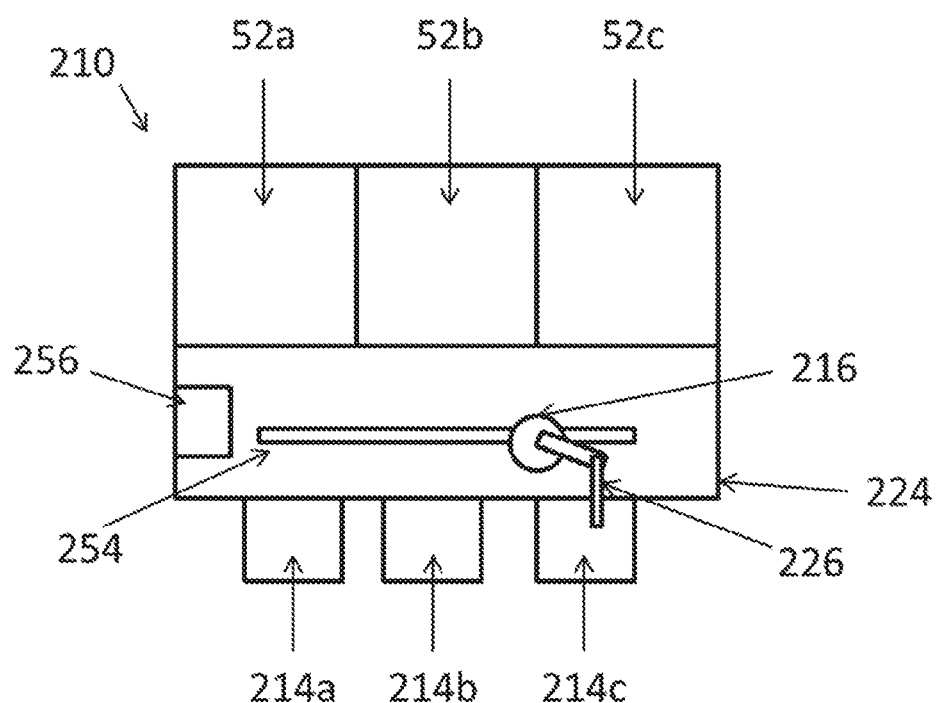
FIG. 6 is a plan view of a wafer processing system comprising rows of stacked processing modules.

FIG. 6 shows a plan view of a second embodiment of a wafer processing system 210 in which vertical stacks 52a-c of the processing modules 18a-d may be arranged in rows. Processing modules 30 of the type described above in relation to FIGS. 3 to 5 may be suitable for use in the wafer processing system 210. Each processing module may be utilised for a different processing step as part of a larger processing procedure.

The wafer processing system 210 may have one or more loading/unloading ports 214a-c. The ports 214a-c allow semiconductor wafers, such as 300 mm diameter silicon wafers, to be loaded into and unloaded from the wafer processing system. The loading/unloading ports 214a-c may individually be cassettes or FOUPs. The ports 214a-c may serve as wafer storage locations in between processing steps.

The transport robot 216 comprises one or more end effectors 226 each of which may independently contact the back face of a wafer (ie. the face of the wafer not subjected to processing) and transfer the wafer to one of the processing modules 18a-d. The transport robot 216 may travel along a track 254 to enable access to each processing module 18a-d in each vertical stack 52a-c.

The robot 216 and vertical stacks 52a-c are housed in a frame 12. The frame 12 provides a contaminant-free environment in which wafer processing can take place. A laminar airflow is produced by a fan or blower to maintain a particulate-free environment within the main chamber 224.

A wafer alignment tool 256 may also be incorporated in the main chamber 224 to ensure correct wafer alignment during wafer transfer.

FIG. 6 shows a wafer processing system 210 incorporating three adjacent vertical stacks 52a-c, however, it would be envisaged that more or fewer vertical stacks may be used. Furthermore, other spatial arrangements, rather than a simply linear system, may be envisaged to achieve an efficient tool footprint.

Figure 7:
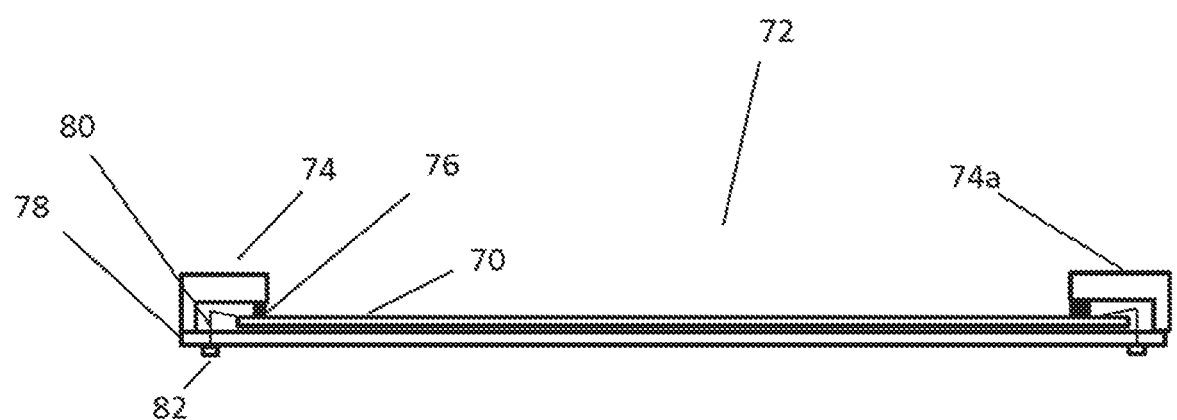
FIG. 7 is a side view of a wafer carrier arrangement.

In the embodiments described above in relation to FIGS. 1 to 6, the wafer itself is introduced into the processing modules. It is possible to instead introduce the wafer into the processing modules mounted on a wafer carrier arrangement. FIG. 7 shows such an embodiment, in which a semiconductor wafer 70 is positioned on a wafer carrier fixture 72. In the embodiment shown in FIG. 7, the wafer carrier fixture 72 comprises a frame 74, a seal 76, and a substrate support 78 which is in communication with the frame 74. The frame 74 comprises an upper surface 74a and carries the seal 76. The wafer 70 is positioned on the substrate support 78. The wafer carrier fixture 72 further comprises an electrical contact 80 and a feedthrough 82 for the electrical contact 80. When the wafer 70 is properly positioned, the electrical contact 80 makes electrical contact with the wafer 70 and the seal 76 seals against the wafer 70 to make a fluid tight seal. The components of the wafer carrier fixture 72 can be formed from any suitable materials. For example, the frame 74 is typically formed from a dielectric material and the seal 76 is typically an elastomeric material such as Viton®.

When the wafer carrier fixture 72 with wafer 70 is loaded into a processing module such as an electrochemical wafer processing module, a fluid seal is made between the module and the upper surface 74a of the frame 74. The alignment constraints for this seal are less stringent than with a fluid seal to the wafer surface. The skilled reader will readily appreciate that there are numerous ways of making a reliable seal to the upper surface 74a.

The wafer carrier fixture 72/wafer 70 assembly can be readily incorporated into the apparatus described in relation to FIGS. 1 to 6 without any major change in the general lay out of the system. For example, the wafer 70 could be inserted into the fixture 72 after leaving the loading/unloading port 14. The wafer 70 would remain in the wafer carrier fixture 72 until after the final processing step is carried out. An additional station or other mechanism can be provided after the loading/unloading port 14 for loading and unloading the wafer onto and from the wafer carrier fixture. Many other arrangements for carrying the wafer and loading the wafer onto the carrier are possible. The benefit of this approach is that the seal and contacts are made only once on the wafer surface.

What is claimed is:

1. A method of processing a semiconductor wafer using an apparatus, the apparatus comprising:
    a main chamber;
    at least one loading port connected to the main chamber for introducing the wafer to the main chamber;
    at least one stack of wafer processing modules comprising three or more substantially vertically stacked wafer processing modules, wherein adjacent wafer processing modules in the stack have a vertical pitch of less than 50 cm, and each processing module is configured to process the wafer when disposed substantially horizontally therein with a front face of the wafer facing upwards, and at least one wafer processing module is an electrochemical wafer processing module;
    a transfer mechanism for transferring the wafer between the loading port and the processing modules; and
    an anode chamber disposed in an opening of a support plate that extends through the support plate from a first surface to an opposite second surface facing a platen assembly, wherein the anode chamber and the support plate are independently movable;
    wherein the method comprises the steps of:
        introducing the wafer to the main chamber via the loading port;
        using the transfer mechanism to transfer the wafer to a first wafer processing module in the stack so that the wafer is disposed substantially horizontally in the first wafer processing module with the front face facing upwards; and
        performing a processing step on the front face of the wafer in the first wafer processing module.

2. The method of claim 1, further comprising the steps of:
    using the transfer mechanism to transfer the wafer from the first wafer processing module to a second wafer processing module in the stack so that the wafer is disposed substantially horizontally in the second wafer processing module; and
    performing a processing step on the front face of the wafer in the second wafer processing module.

3. The method of claim 1, further comprising the step of:
    using the transfer mechanism to transfer the wafer from a wafer processing module to the loading port for subsequent transfer out of the apparatus.

4. The method of claim 1, wherein at least one processing step performed on the front face of the wafer is selected from the group comprising a chemical, electrochemical, rinsing, cleaning, spinning, or drying step.

5. The method of claim 4, wherein a processing step performed on the front face of the wafer is an electrochemical processing step performed in the electrochemical wafer processing module, wherein the electrochemical wafer processing module comprises a seal which seals against a surface to define a sealed cavity in which electrochemical processing takes place.

6. The method of claim 5, wherein the surface is an upper surface of the wafer.

7. The method of claim 1, wherein the apparatus further comprises:
   at least one wafer carrier arrangement onto which the wafer can be loaded, the wafer carrier arrangement comprising a seal which, in use, seals against a surface of the wafer wherein the transfer mechanism is configured to transfer a loaded wafer carrier arrangement between the loading port and the processing modules.

8. The method of claim 7, wherein the apparatus further comprises:
   a wafer carrier arrangement loading station for loading the wafer onto the wafer carrier arrangement.

9. The method of claim 1, wherein the vertical pitch is less than 25 cm.

10. The method of claim 1, wherein the transfer mechanism comprises a transfer robot having at least one end effector for automated transfer of the wafer between the loading port and the processing modules.

11. The method of claim 1, wherein at least one of the wafer processing modules comprises an electrochemical deposition wafer processing module.

12. The method of claim 1, wherein the front face of the wafer comprises an electrode.

13. The method of claim 1, wherein the processing modules are removable from the stack.

14. The method of claim 13, wherein the processing modules are removable from the stack in a substantially horizontal direction.

15. The method of claim 13, wherein the processing modules are removable from the stack by rotating or sliding.

16. The method of claim 1, wherein the apparatus further comprises:
   a tilting bracket for the processing module that is disposed on the support plate, wherein the processing module is configured to be tilted using the tilting bracket.

17. A method of servicing an apparatus, the apparatus comprising:
   a main chamber;
   at least one loading port connected to the main chamber for introducing the wafer to the main chamber;
   at least one stack of wafer processing modules comprising three or more substantially vertically stacked wafer processing modules, wherein adjacent wafer processing modules in the stack have a vertical pitch of less than 50 cm, and each processing module is configured to process the wafer when disposed substantially horizontally therein with a front face of the wafer facing upwards, and at least one wafer processing module is an electrochemical wafer processing module;
   a transfer mechanism for transferring the wafer between the loading port and the processing modules; and
   an anode chamber disposed in an opening of a support plate that extends through the support plate from a first surface to an opposite second surface facing a platen assembly, wherein the anode chamber and the support plate are independently movable;
   wherein the method comprises the step of:
   removing a wafer processing module from the stack in a substantially horizontal direction for providing access to the wafer processing module.

18. The method of claim 17, wherein the step of removing the wafer processing module from the stack in a substantially horizontal direction comprises rotating or sliding the processing module.

19. The method of claim 17, wherein each processing module is configured to process the wafer when disposed substantially horizontally therein on a platen assembly;
   wherein the apparatus further comprises:
   a tilting bracket for the processing module that is disposed on the support plate, wherein the processing module is configured to be tilted using the tilting bracket.

* * * * *